(12) United States Patent
Kim

(10) Patent No.: US 8,957,421 B2
(45) Date of Patent: Feb. 17, 2015

(54) FLAT PANEL DISPLAY AND METHOD OF MANUFACTURING THE SAME

(71) Applicant: Samsung Display Co., Ltd., Yongin, Gyeonggi-Do (KR)

(72) Inventor: Jong-Seok Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 75 days.

(21) Appl. No.: 13/680,781

(22) Filed: Nov. 19, 2012

(65) Prior Publication Data

US 2014/0048808 A1    Feb. 20, 2014

(30) Foreign Application Priority Data

Aug. 20, 2012 (KR) ................ 10-2012-0090751

(51) Int. Cl.
*H01L 29/786* (2006.01)
*H01L 33/08* (2010.01)
*H01L 27/12* (2006.01)

(52) U.S. Cl.
CPC .............. *H01L 29/786* (2013.01); *H01L 33/08* (2013.01); *H01L 27/124* (2013.01)
USPC .......... 257/59; 257/71; 257/72; 257/E33.003; 257/E33.004; 257/66

(58) Field of Classification Search
USPC ........... 257/59, 72, E33.003, E33.004, 71, 66
See application file for complete search history.

(56) References Cited

U.S. PATENT DOCUMENTS

| | | | |
|---|---|---|---|
| 7,557,501 | B2 | 7/2009 | Kim |
| 7,576,482 | B2 | 8/2009 | Oh |
| 7,622,739 | B2 | 11/2009 | Kim |
| 7,656,087 | B2 | 2/2010 | Kim et al. |
| 7,727,823 | B2 | 6/2010 | Jeong et al. |
| 7,936,125 | B2 | 5/2011 | Kim et al. |
| 7,973,315 | B2 | 7/2011 | Koo et al. |
| 8,063,550 | B2 | 11/2011 | Kim et al. |
| 8,222,809 | B2 | 7/2012 | Lee et al. |
| 8,278,722 | B2 | 10/2012 | Kang et al. |
| 2001/0011984 | A1 | 8/2001 | Hong |
| 2003/0098837 | A1 | 5/2003 | Iwamoto et al. |
| 2005/0179378 | A1 | 8/2005 | Oooka et al. |
| 2008/0197357 | A1 | 8/2008 | Park et al. |
| 2009/0072729 | A1 | 3/2009 | Kim et al. |
| 2010/0176394 | A1 | 7/2010 | Park et al. |
| 2011/0297945 | A1* | 12/2011 | Jung et al. ................. 257/59 |

(Continued)

FOREIGN PATENT DOCUMENTS

KR    2003-0043672    6/2003
KR    10-2006-0041946    5/2006

(Continued)

*Primary Examiner* — Cathy N Lam
(74) *Attorney, Agent, or Firm* — Robert E. Bushnell, Esq.

(57) ABSTRACT

In a flat panel display (FPD) and a method of manufacturing the same, the FPD includes a substrate, a semiconductor layer formed on the substrate, a wiring line formed on the substrate so as to be separated from the semiconductor layer, an insulating layer formed on the semiconductor layer and the wiring line, a gate electrode formed on the insulating layer formed on the semiconductor layer and extended to a top of the wiring line, and a source electrode and a drain electrode coupled to a source region and a drain region, respectively, of the semiconductor layer. Capacitance is formed by the gate electrode and the wiring line.

5 Claims, 4 Drawing Sheets

(56) References Cited

U.S. PATENT DOCUMENTS

| | | |
|---|---|---|
| 2012/0056523 A1 | 3/2012 | Han et al. |
| 2012/0106044 A1 | 5/2012 | Kwon et al. |
| 2012/0113087 A1 | 5/2012 | Taussig et al. |
| 2012/0162050 A1 | 6/2012 | Zhan et al. |
| 2014/0118653 A1* | 5/2014 | Umezaki ........................ 349/43 |

FOREIGN PATENT DOCUMENTS

| | | |
|---|---|---|
| KR | 10-0604718 | 7/2006 |
| KR | 10-2012-0032005 | 4/2012 |

* cited by examiner

FLAT PANEL DISPLAY AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 20$^{th}$ of August 20 and there duly assigned Serial No. 10-2012-0090751.

BACKGROUND OF THE INVENTION

1. Field of the Invention

The present invention relates to a flat panel display and a method of manufacturing the same, and more particularly, to a flat panel display capable of preventing picture quality from deteriorating due to parasitic capacitance between thin film transistors (TFTs) and wiring lines for transmitting signals.

2. Description of the Related Art

A flat panel display (FPD) such as a liquid crystal display (LCD) and an organic light emitting display (OLED) includes thin film transistors (TFTs) for transmitting signals in order to drive pixels and capacitors for maintaining the signals. The TFTs and the capacitors are electrically coupled to each other by wiring lines to transmit or maintain signals.

Since the distances among the TFTs, the capacitors, and the wiring lines are reduced as the resolution of the FPD increases, problems are generated. For example, when a TFT is adjacent to a wiring line, parasitic capacitance is generated between one electrode of the TFT and the wiring line by an insulating layer formed between the TFT and the wiring line. Since the parasitic capacitance distorts a voltage or a signal applied to the electrode or the wiring line, picture quality may be deteriorated by the parasitic capacitance.

SUMMARY OF THE INVENTION

Accordingly, the present invention has been developed to provide a flat panel display (FPD) capable of preventing picture quality from being deteriorated by parasitic capacitance between thin film transistors (TFTs) and wiring lines, and a method of manufacturing the same.

In order to achieve the foregoing and/or other aspects of the present invention, there is provided a flat panel display (FPD), including a substrate, a semiconductor layer formed on the substrate, a wiring line formed on the substrate so as to be separated from the semiconductor layer, an insulating layer formed on the semiconductor layer and the wiring line, a gate electrode formed on the insulating layer which is formed on the semiconductor layer and extended to a top of the wiring line, and a source electrode and a drain electrode coupled to a source region and a drain region, respectively, of the semiconductor layer.

There is provided a method of manufacturing a FPD, including forming a semiconductor layer on a substrate, forming a first insulating layer on the substrate including the semiconductor layer, forming a wiring line on the first insulating layer so as to be separated from the semiconductor layer, forming a second insulating layer on the semiconductor layer and the wiring line, forming a gate electrode on the second insulating layer which is formed on the semiconductor layer so as to be extended to the top of the wiring line, forming a third insulating layer on the gate electrode, forming a contact hole so that the source region and the drain region of the semiconductor layer are exposed, and forming a source electrode and a drain electrode so as to be coupled to the source region and the drain region, respectively, through the contact hole.

According to an embodiment of the present invention, the gate electrode of the TFT is extended to the top of the adjacent wiring line so that capacitance is formed by the gate electrode and the wiring line that overlap each other. When the capacitance is formed between the TFT and the wiring line adjacent to the TFT, although a kick back phenomenon is generated, since a change in the voltage of the gate electrode of the TFT and/or the wiring line is uniform or minimized, all of the pixels may emit light with uniform brightness, and it is possible to effectively prevent picture quality from being deteriorated by the parasitic capacitance.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
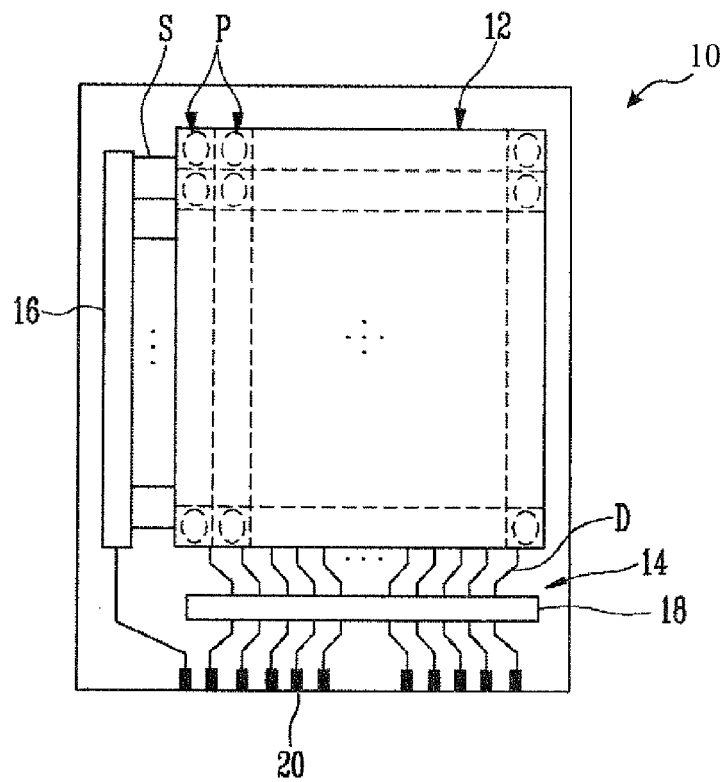
FIG. 1 is a schematic plan view illustrating a flat panel display (FPD) according to an embodiment of the present invention.

Hereinafter, certain exemplary embodiments according to the present invention will be described with reference to the accompanying drawings. Here, when a first element is described as being coupled to a second element, the first element may be directly coupled to the second element or it may be indirectly coupled to the second element via a third element. Furthermore, some of the elements that are not essential to a complete understanding of the invention are omitted for clarity. Also, like reference numerals refer to like elements throughout.

Hereinafter, exemplary embodiments of the present invention will be described in detail with reference to the accompanying drawings. The embodiments are provided so that those skilled in the art may fully understand the present invention. Various modifications are available and the scope of the present invention is not limited to the following embodiments.

FIG. 1 is a schematic plan view illustrating a flat panel display (FPD) according to an embodiment of the present invention.

A substrate 10 is defined by a pixel region 12 in which a plurality of pixel units P are arranged and a non-pixel region 14 surrounding the pixel region 12.

The plurality of pixel units P are arranged in row and column directions in the pixel region 12 of the substrate 10. The plurality of pixel units P may be coupled between a plurality of scan lines S arranged in a row direction and a plurality of data lines D arranged in a column direction in a matrix.

Each of the pixel units P includes a pixel and a pixel circuit for driving the pixel. The pixel circuit includes a thin film transistor (TFT) for driving the pixel and a capacitor coupled to the TFT to maintain a signal.

In the non-pixel region 14 of the substrate 10, a scan driver 16 coupled to the scan lines S extending from the pixel region 12, a data driver 18 coupled to the data lines D extending from the pixel region 12, and a plurality of pads 20 to which signals are inputted from the outside are arranged. The scan driver 16 and the data driver 18 are coupled to the pads 20 through wiring lines and convert signals provided from the outside through the pads 20 into scan signals and data signals so as to selectively drive the pixel units P.

Figure 2:
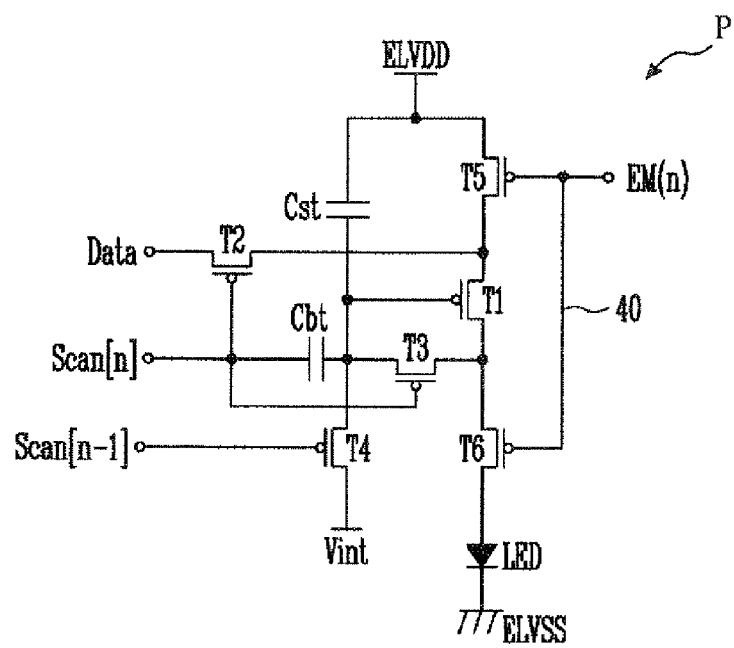
FIG. 2 is a circuit diagram illustrating an embodiment of the pixel unit P of FIG. 1.

FIG. 2 is a circuit diagram illustrating an embodiment of the pixel unit P of FIG. 1.

Referring to FIG. 2, the pixel unit P includes a pixel and a pixel circuit for driving the pixel.

The pixel may be formed of an organic light emitting diode (OLED). The OLED includes an anode electrode, a cathode electrode, and an organic thin film layer formed between the anode electrode and the cathode electrode. The organic thin film layer has a structure in which a hole transporting layer, an organic light emitting layer, and an electron transporting layer are laminated and may further include a hole injecting layer and an electron injecting layer.

The pixel circuit P includes a plurality of thin film transistors (TFT) T1 to T6 coupled between a scan line S and a data line D and capacitors Cst and Cbt.

The TFTs T2 to T4 are driven by a scan signal provided through the scan line S. The TFTs T5 and T6 transmit a power supply voltage ELVDD in accordance with an emission control signal EM. The TFT T1 provides current corresponding to a data signal provided to the OLED through the data line D.

The capacitor Cst maintains the data signal for a uniform period. The capacitor Cbt controls the voltage of the gate electrode of the TFT T1 so as to correspond to the scan signal.

The OLED is coupled between the TFT T6 and a common voltage ELVSS and may emit, for example, red, green, and blue light components or white light.

In the pixel unit P, wiring lines for coupling the circuit and for transmitting signals are formed among the TFTs. For example, a wiring line 40 for transmitting the emission control signal EM is formed on one side of the TFT T1.

In such a case, parasitic capacitance is generated between the TFT and the wiring line. Since the distances between the TFTs and the wiring lines adjacent thereto are non-uniform, the parasitic capacitance is non-uniformly distributed. The non-uniform parasitic capacitance may cause a kick back phenomenon to deteriorate picture quality.

For example, when the emission control signal EM is changed from a high state to a low state, the kick back phenomenon, in which the voltage of the gate electrode of the TFT T1 and/or the voltage of the wiring line 40 are distorted (changed) by the parasitic capacitance, is generated so that a horizontal line spot is generated along the wiring line 40.

In order to minimize the kick back phenomenon, the distance between the TFT T1 and the wiring line 40 is to be increased so that the parasitic capacitance is minimized. As the resolution of the display device increases, it is difficult to secure the distance.

According to the embodiment of the present invention, in order to solve the problem, uniform capacitance is formed between the TFTs and the wiring lines.

Figure 3:
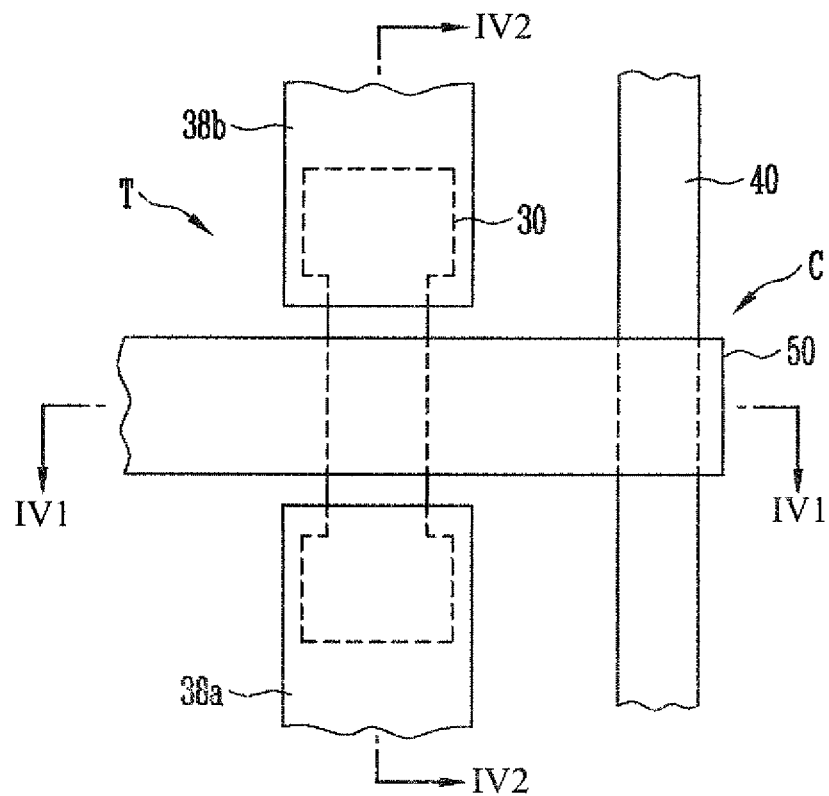
FIG. 3 is a plan view illustrating the FPD according to the embodiment of the present invention.
Figure 4A:
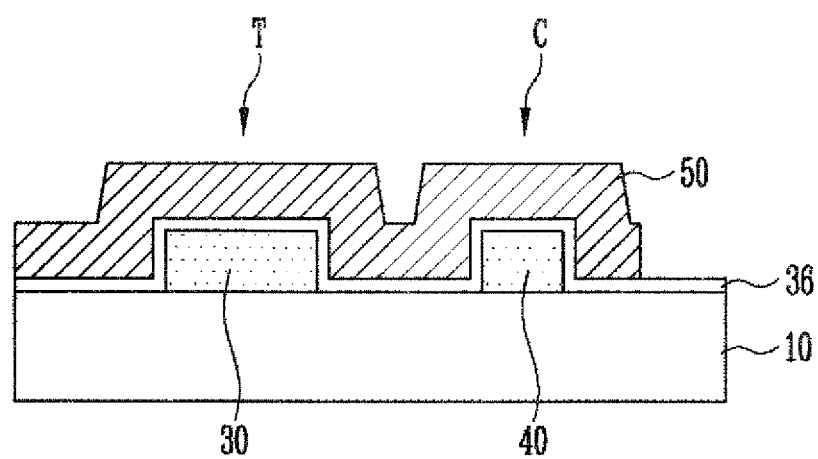
FIGS. 4A and 4B are sectional views taken along the line IV1-IV1 of FIG. 3.
Figure 4B:
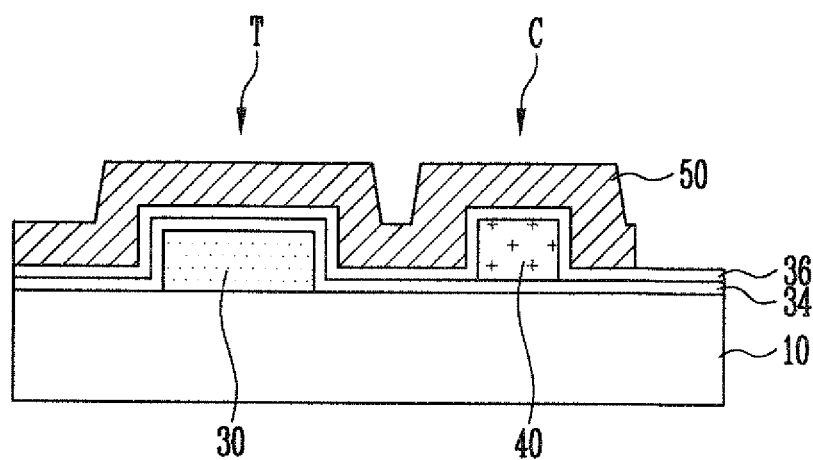
Figure 4C:
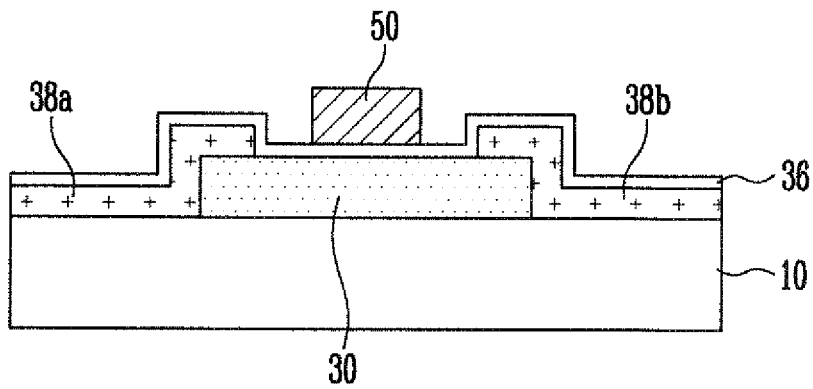
FIG. 4C is a sectional view taken along the line IV2-IV2 of FIG. 3.

FIG. 3 is a plan view illustrating the FPD according to the embodiment of the present invention, FIGS. 4A and 4B are sectional views taken along the line IV1-IV1 of FIG. 3, and FIG. 4C is a sectional view taken along the line IV2-1V2 of FIG. 3.

Referring to FIG. 3, the TFT T and the wiring line 40, arranged to be adjacent to each other, are schematically illustrated. Referring to FIGS. 3 and 4A, a semiconductor layer 30 and the wiring line 40 are formed on the substrate 10 so as to be separated from each other by a uniform distance. The substrate 10 may be a transparent glass substrate, a plastic substrate, or a metal substrate. The semiconductor layer 30 may be formed of amorphous silicon, poly silicon, or oxide semiconductor. The wiring line 40 may be formed of the same material as the semiconductor layer 30 and, referring to FIG. 4B, impurity ions may be injected into the wiring line 40 so that the wiring line 40 has conductivity.

Referring to FIGS. 3 and 4C, a source electrode 38a and a drain electrode 38b are formed so as to be coupled to the source region, respectively, and the drain region of the semiconductor layer 30.

Referring to FIGS. 3, 4A, 4B and 4C, an insulating layer 36 is formed on the substrate 10 including the semiconductor layer 30, the source electrode 38a, the drain electrode 38b and the wiring line 40, and a gate electrode 50 is formed on the insulating layer 36 which is formed on the semiconductor layer 30. At this time, the gate electrode 50 is formed so as to be extended to the top of the wiring line 40. (see FIG. 3).

Referring to FIGS. 3 and 4B, the wiring line 40 may be formed of a metal such as Mo and W, and an insulating layer 34 maybe formed between the wiring line 40 and the substrate 10. In this case, the insulating layer 34 is formed on the substrate 10 including the semiconductor layer 30, and the wiring line 40 is formed on the insulating layer 34 so as to be separated from the semiconductor layer 30 by a uniform distance. The insulating layer 36 is formed on the insulating layer 34 including the wiring line 40, and the gate electrode 50 is formed on the insulating layer 36.

Figure 5:
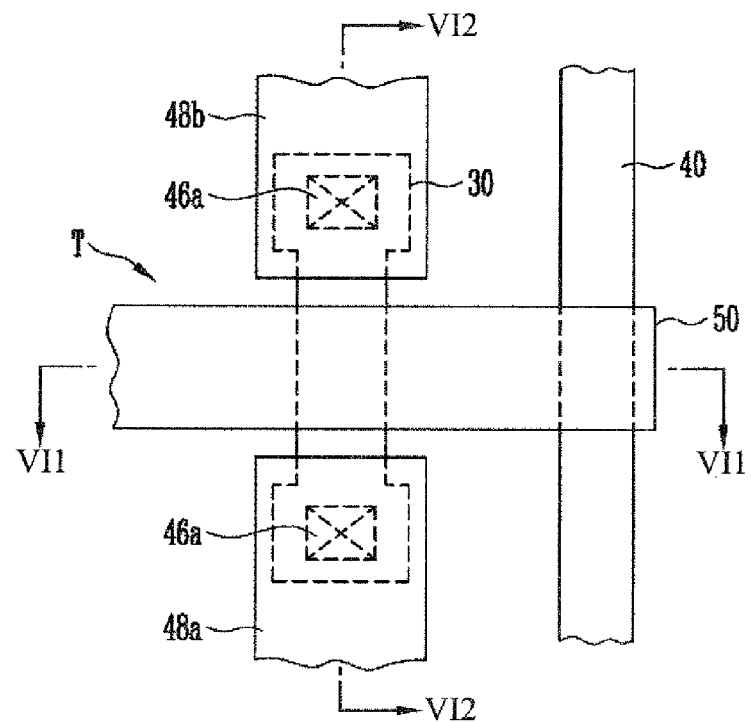
FIG. 5 is a plan view illustrating a FPD according to another embodiment of the present invention.
Figure 6A:
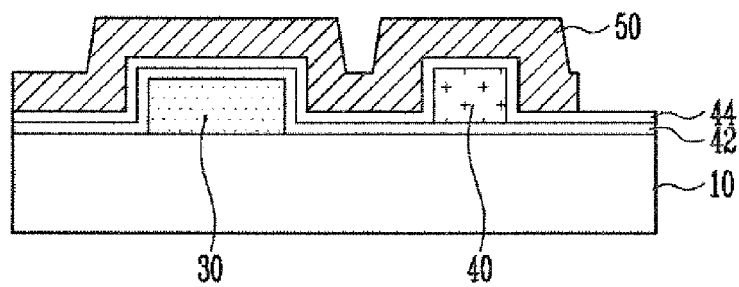
FIG. 6A is a sectional view taken along the line VI1-VI1 of FIG. 5.
Figure 6B:
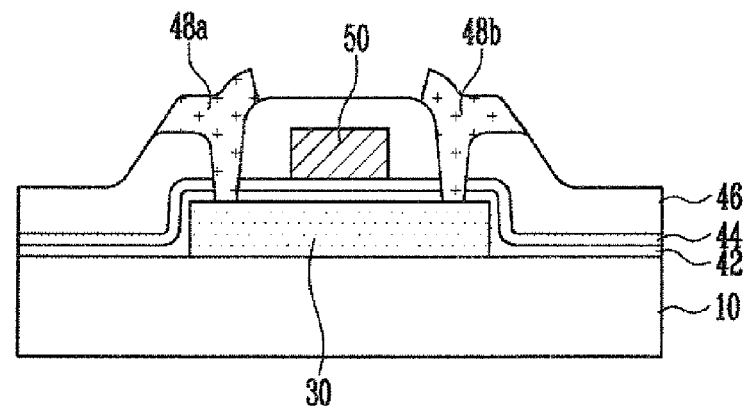
FIG. 6B is a sectional view taken along the line VI2-VI2 of FIG. 5.

FIG. 5 is a plan view illustrating a FPD according to another embodiment of the present invention, FIG. 6A is a sectional view taken along the line VI1-VI1 of FIG. 5, and FIG. 6B is a sectional view taken along the line VI2-VI2 of FIG. 5.

In FIG. 5, the TFT T and the wiring line 40, arranged to be adjacent each other, are schematically illustrated. The FPD of FIG. 5 has a similar lamination structure to the FPD of FIG. 3. However, the lamination structure of the FPD of FIG. 5 is different from the lamination structure of the FPD of FIG. 3 in that a source electrode 46a and a drain electrode 46b are arranged above the gate electrode 50.

Referring to FIGS. 5 and 6A, the semiconductor layer 30 is formed on the substrate 10, and an insulating layer 42, as a first insulating layer, is formed on the substrate 10 including the semiconductor layer 30.

The wiring line 40 is formed on the insulating layer 42 so as to be separated from the semiconductor layer 30 by a uniform distance, and an insulating layer 44 as a second insulting layer is formed on the semiconductor layer 30 and the wiring line 40.

The gate electrode 50 is formed on the insulating layer 44 formed on the semiconductor layer 30. At this time, the gate electrode 50 is formed so as to be extended to the top of the wiring line 40.

Referring to FIGS. 5 and 6B, an insulating layer 46 as a third insulating layer is formed on the insulating layer 44, including the gate electrode 50, and a source electrode 48a and a drain electrode 48b are formed on the insulating layer 46 so as to be coupled to the source region and the drain region, respectively, of the semiconductor layer 30 through a contact hole 46a. The source electrode 48a and the drain electrode 48b may be formed of a metal such as Mo, Ti, and Al or a lamination structure of the above metals, for example, a structure in which Ti, Al, and Ti are laminated.

As described above, according to the embodiment of the present invention, the gate electrode 50 of the TFT T is formed so as to be extended to the top of the adjacent wiring line 40 so that capacitance C is formed by the wiring line 40 and the gate electrode 50.

In the embodiment, the wiring line 40 and the adjacent TFT are described. However, the embodiment of the present invention may be applied to the TFTs that form the pixel circuit, for example, the TFTs T1 to T6 of FIG. 1 and the wiring lines adjacent to the TFTs T1 to T6. The embodiment may be effectively applied to a driving TFT in which current that flows through source and drain electrodes is controlled in accordance with the voltage of a gate electrode.

According to the embodiment of the present invention, the capacitance C may be uniformly formed. In order to realize the uniform capacitance C, the gate electrode 50 of the TFT T may be formed to sufficiently cover the wiring line 40, and the area in which the gate electrode 50 and the wiring line 40 overlap each other may be uniform.

The capacitance between the TFT and wiring line is uniformly maintained so that, although the kick back phenomenon is generated, a change in the voltage of the gate electrode of the TFT is uniform or minimized. Therefore, the pixel may emit light with uniform brightness, and it is possible to prevent picture quality from being deteriorated by the parasitic capacitance.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A flat panel display (FPD) device, comprising:
   a substrate;
   a semiconductor layer formed on the substrate;
   a wiring line formed on the substrate so as to be separated from the semiconductor layer;
   an insulating layer formed on the semiconductor layer and the wiring line;
   a gate electrode formed on the insulating layer, the gate electrode continuously and completely overlying the wiring line which is formed on the semiconductor layer, and extended to a top of the wiring line; and
   a source electrode and a drain electrode coupled to a source region and a drain region, respectively, of the semiconductor layer.

2. The FPD device as claimed in claim 1, the wiring line being formed of a same material as the semiconductor layer, and impurity ions being injected into the wiring line.

3. The FPD device as claimed in claim 1, the wiring line being formed of a metal.

4. The FPD device as claimed in claim 3, further comprising an insulating layer formed between the wiring line and the substrate.

5. The FPD device as claimed in claim 1, the source electrode and the drain electrode being coupled to a source region and a drain region, respectively, of the semiconductor layer through a contact hole formed in an insulating layer.

* * * * *